United States Patent
Dong et al.

(10) Patent No.: US 8,957,959 B2
(45) Date of Patent: Feb. 17, 2015

(54) CHARGED PARTICLE MICROSCOPE AND MEASUREMENT IMAGE CORRECTION METHOD THEREOF

(75) Inventors: Shuangqi Dong, Matsudo (JP); Norio Sato, Hitachiota (JP); Susumu Koyama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/981,326

(22) PCT Filed: Nov. 2, 2011

(86) PCT No.: PCT/JP2011/006128
§ 371 (c)(1),
(2), (4) Date: Jul. 24, 2013

(87) PCT Pub. No.: WO2012/111054
PCT Pub. Date: Aug. 23, 2012

(65) Prior Publication Data
US 2013/0300854 A1    Nov. 14, 2013

(30) Foreign Application Priority Data
Feb. 17, 2011  (JP) .................................. 2011-031516

(51) Int. Cl.
*H01J 37/26*      (2006.01)
*H04N 5/217*     (2011.01)
(Continued)

(52) U.S. Cl.
CPC .............. *H04N 5/217* (2013.01); *H01J 37/222* (2013.01); *H01J 37/26* (2013.01); *H01J 2237/153* (2013.01)
USPC ............................................ 348/80; 250/311

(58) Field of Classification Search
USPC ........................................................... 348/80
See application file for complete search history.

(56) References Cited

U.S. PATENT DOCUMENTS 6,570,156 B1 * 5/2003 Tsuneta et al. ................ 250/311
7,271,396 B2 * 9/2007 Shemesh ................... 250/396 R
(Continued)

FOREIGN PATENT DOCUMENTS

JP        07-272665 A    10/1995
JP        2000149853     5/2000
(Continued)

OTHER PUBLICATIONS

JP Office Action in JP App. No. JP2011-031516, dated Nov. 12, 2013.

*Primary Examiner* — Sath V Perungavoor
*Assistant Examiner* — Howard D Brown, Jr.
(74) *Attorney, Agent, or Firm* — Mattingly & Malur, PC (57) ABSTRACT

A charged particle microscope corrects distortion in an image caused by effects of drift in the sampling stage by measuring the correction reference image in a shorter time than the observation image, making corrections by comparing the shape of the observation image with the shape of the correction reference image, and reducing distortion in the observation images. The reference image for distortion correction is measured at the same position and magnification as when acquiring images for observation. In order to reduce effects from drift, the reference image is at this time measured within a shorter time than the essential observation image. The shape of the observation image is corrected by comparing the shapes of the reference image and observation image, and correcting the shape of the observation image to match the reference image.

6 Claims, 9 Drawing Sheets

DEVICE BLOCK DIAGRAM (51) Int. Cl.
*H01J 37/22* (2006.01)
*G21K 7/00* (2006.01)

(56) References Cited

U.S. PATENT DOCUMENTS

| | | | |
|---|---|---|---|
| 7,633,064 B2* | 12/2009 | Tsuneta et al. | 250/310 |
| 2005/0012050 A1* | 1/2005 | Shemesh | 250/491.1 |
| 2006/0060781 A1* | 3/2006 | Watanabe et al. | 250/310 |
| 2008/0093551 A1* | 4/2008 | Tsuneta et al. | 250/310 |
| 2009/0127474 A1* | 5/2009 | Tsuneta et al. | 250/442.11 |
| 2012/0287258 A1* | 11/2012 | Tsuneta et al. | 348/80 |

FOREIGN PATENT DOCUMENTS

| | | |
|---|---|---|
| JP | 2000-331637 A | 11/2000 |
| JP | 2003-086126 A | 3/2003 |
| JP | 2007-200784 A | 8/2007 |
| JP | 2009-110734 A | 5/2009 |
| WO | 2011/007492 A1 | 1/2011 |

* cited by examiner

FIG.1

DEVICE BLOCK DIAGRAM

CHARGED PARTICLE MICROSCOPE AND MEASUREMENT IMAGE CORRECTION METHOD THEREOF

TECHNICAL FIELD

The present invention relates to a charged particle microscope and a method for correcting measurement images by utilizing the charged particle microscope.

BACKGROUND ART

The charged particle microscope is widely used for observing the structure of substances at a high magnification. However, drift can sometimes occur due to the characteristics of the specimen and the equipment stage. Charged particle microscopes generally shift the imaging field of view by moving a stage carrying a specimen placed on a sampling stage. However, due to problems with mechanical precision, the stage does not suddenly stop even if stop operation was initiated and still continues to moves even though only a small distance. Drift is caused mainly by the slight movement of the sampling stage after stop operation.

In the charged particle microscope, the capture of the image for observation requires a long time ranging from a few seconds to several dozen seconds and moreover is imaging that is enlarged to a high magnification so that even just a slight amount of drift causes distortion to appear in the image. However, finding what extent of image displacement has occurred due to drift, or finding in what direction the displacement amount occurred, just in the image where distortion occurred was impossible (in the related art) so preventing distortion from entering the image at the time of measurement or some type of method for correcting distortion in the image is needed.

One way to prevent distortion from entering an image during measurement, is to start the observation after waiting for the sampling stage to come to a complete stop after operation to stop the sampling stage movement however the image capture efficiency in that case is extremely poor. In order to resolve the problem, a variety of methods to correct image distortion due to drift were contrived.

The patent literature 1 for example discloses a drift correction method to correct slow-scan images by utilizing results from finding the drift amount (drift speed) per unit of time in the X direction and the Y direction from two fast-scan images (television scanning image) in order to find the displacement amount, due to drift in the image captured by slow-scan.

CITATION LIST

Patent Literature

Patent literature 1: Domestic Re-publication of PCT International Application WO2003/004821 (U.S. Pat. No. 703, 296)

SUMMARY OF INVENTION

Technical Problem

The method that starts measurement after waiting for movement of the sampling stage to stop requires waiting for the sampling stage to come to a complete stop whenever the sampling stage moves and so there is a drastic drop in operability during observation. The drift correction method disclosed in patent literature 1 on the other hand, corrects one image from among at least three images, however the number of captured images relates to the direct device throughput and damage to the specimen and so a drift correction method is needed that achieves the drift correction from as few images as possible.

The present invention has the object of providing drift correction from as few captured images as possible.

Solution to Problem

In order to resolve the aforementioned problems, a reference image is measured in order to correct distortion at a position and magnification identical to the image acquired for observation. The reference image is at this time measured within a shorter time than the actual observation image in order to lessen the effects of drift. The reference image performs the measurement in a short time compared to the observation image so the signal volume decreases and the reference image cannot be used for making observations. However the reference image has little distortion compared to the observation image and so correctly reflects the shape of the specimen. The shape of the observation image is corrected by comparing the shapes of the reference image and observation image, and then correcting the shape of the observation image to match the shape of the reference image.

Advantageous Effects of the Invention

The present invention does not require waiting until the sampling stage has fully stopped before starting observation. Moreover, the correction of the related art required the acquisition of three images however the present invention can perform correction with two images.

DESCRIPTION OF EMBODIMENTS

First Embodiment

The embodiments of the present invention are described next while referring to the drawings.

Figure 1:
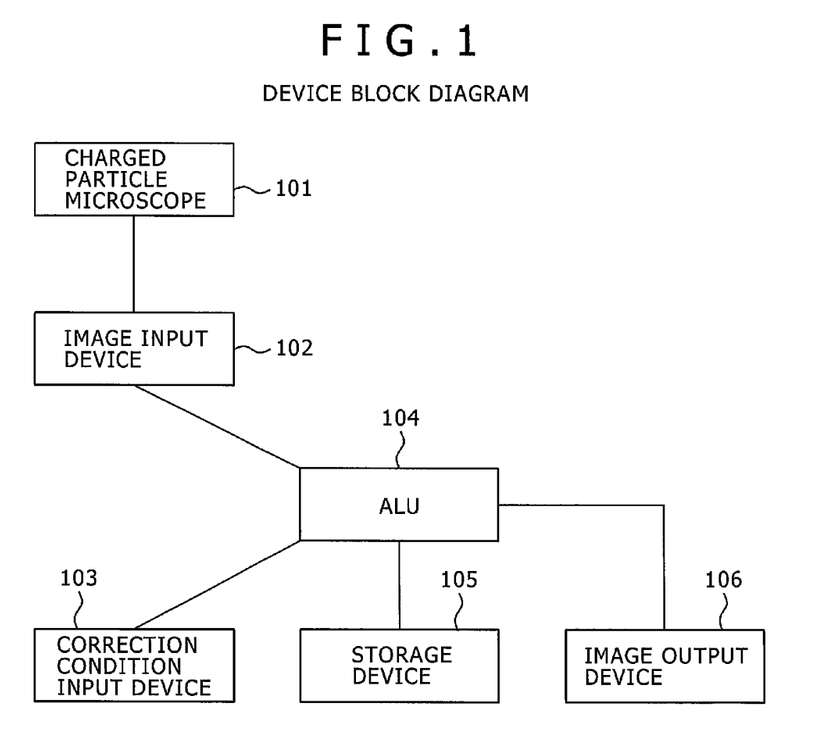
FIG. 1 is a block diagram of the device structure.

FIG. 1 is a drawing showing the structure of the device for achieving the present invention. A charged particle microscope 101 is a microscope utilizing charged particles and that obtains image at a high magnification by irradiating charged particles onto the specimen. Generally known microscopes that use an electron beam are the scanning electron microscope and transmission electron microscope. Images acquired by the charged particle microscope 101 are obtained by the image input device 102. Images acquired by the image input device 102 can be stored in the storage device 105. The images measured by using the charged particle microscope 101 and the image input device 102 are corrected on the arithmetic logic unit (ALU) 104 based on correction conditions input by the correction condition input device 103, and the images are output from the image output device 106.

Figure 2:
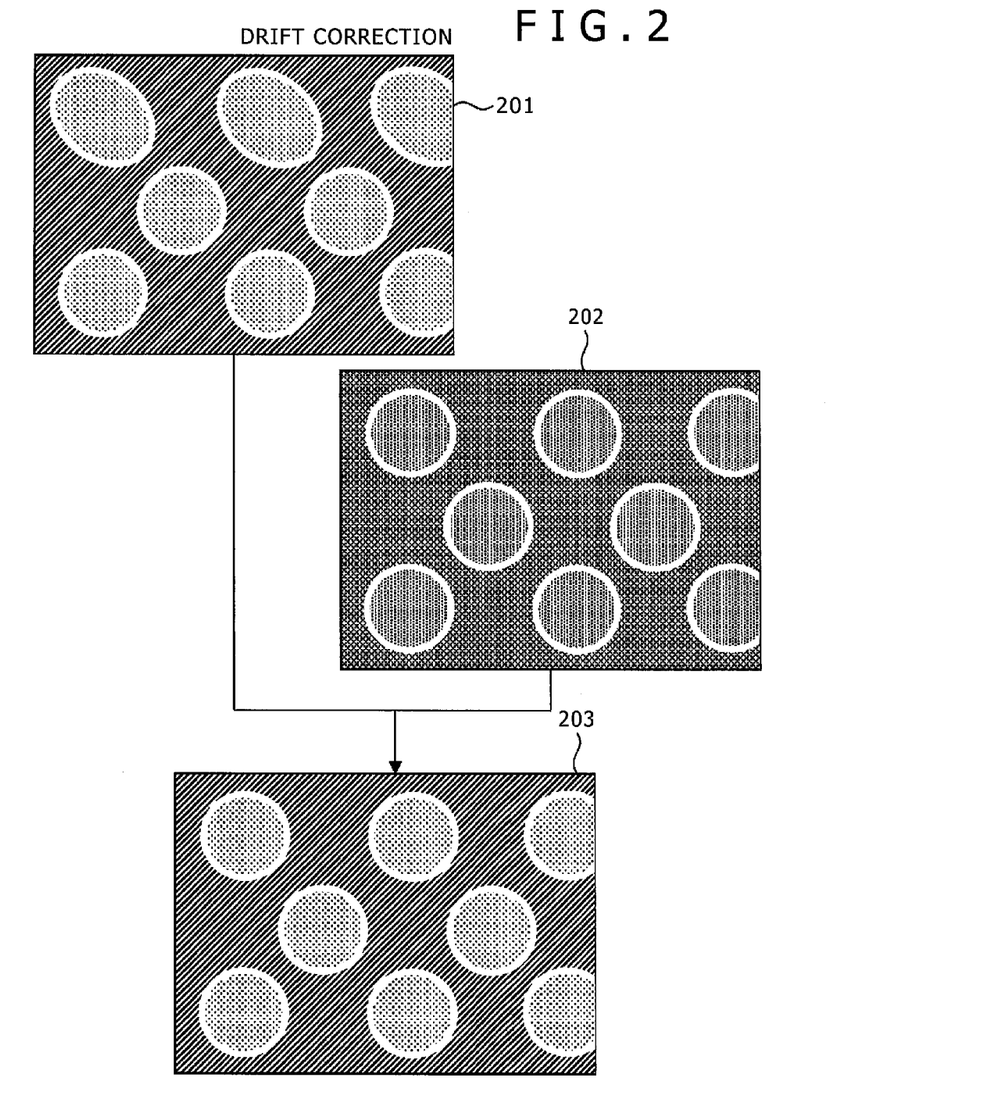
FIG. 2 is illustrations showing drift correction.

FIG. 2 is images showing the content implemented by the present invention. An observation image 201 is an image measured for observation purposes using the charged particle microscope 101. The measurement is made in a period ranging from a few to several dozen seconds in order to obtain high image quality and so contains much distortion. The correction reference image 202 like the observation image 201 is an image measured by using the charged particle microscope 101. The correction reference image 202 measures faster than the observation image 201 in order to alleviate the effects of drift in the sampling stage. The observation image 201 for example measures at 40 seconds and so when the correction reference image 202 measures at 40 milliseconds the effect of drift in the sampling stage is $\frac{1}{1000}^{th}$. A corrected observation image 203 is acquired by comparing the shape of the observation image 201 with the correction reference image 202 and making corrections. The sampling stage drift movement is for here the case where moving in the lateral direction and where moving in the vertical direction, and moreover in the diagonal direction utilizing the lateral and vertical components.

Figure 3:
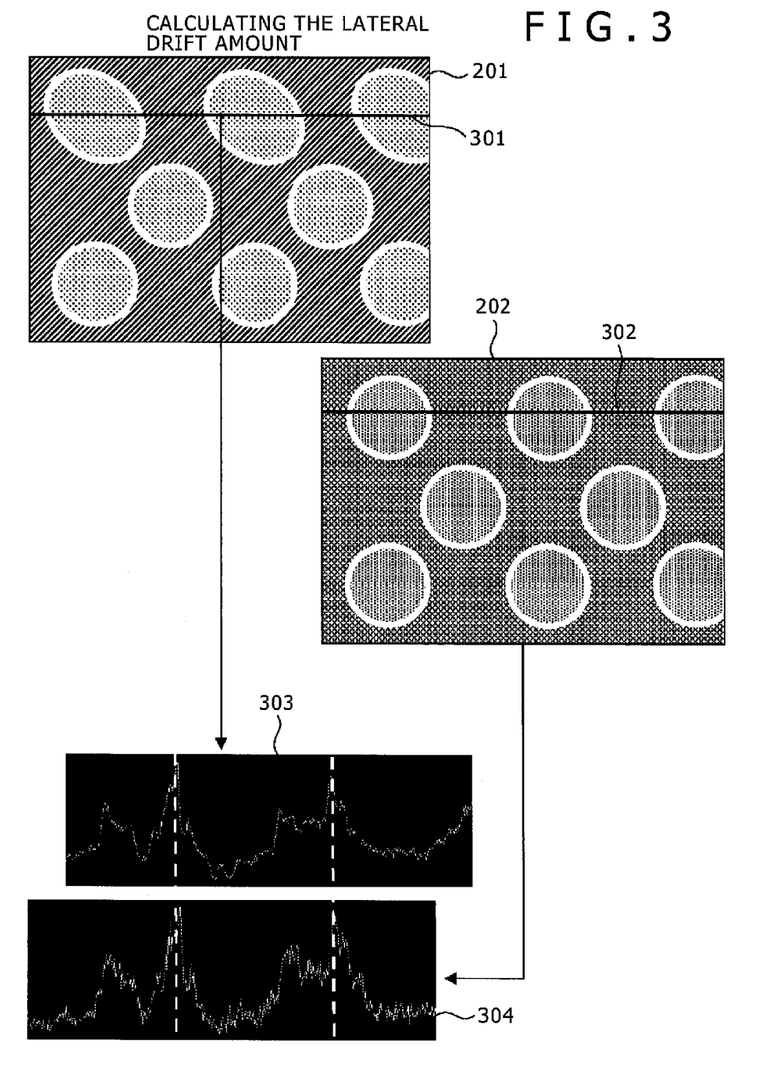
FIG. 3 is illustrations showing lateral drift amount calculation.

FIG. 3 is illustrations for describing the correction of lateral drift. A profile position 301 is set along the line for verifying the shape of the image at a desired location laterally on the observation image 201. A profile position 302 is also set on the correction reference image 202 at the same position as the profile position 301 set on the observation image. The profile 303 is an image profile for the profile position 301 that was set on the observation image 201. The profile 304 is an image profile for the profile position 302 that was set on the correction reference image 202. The amount of movement in the lateral direction can be found by comparing the shape of these two profiles. The drift amount for the entire image can be obtained by sequentially detecting the drift amount on each line while shifting the position where the profile was set from the top edge to the bottom edge of the image.

Figure 4:
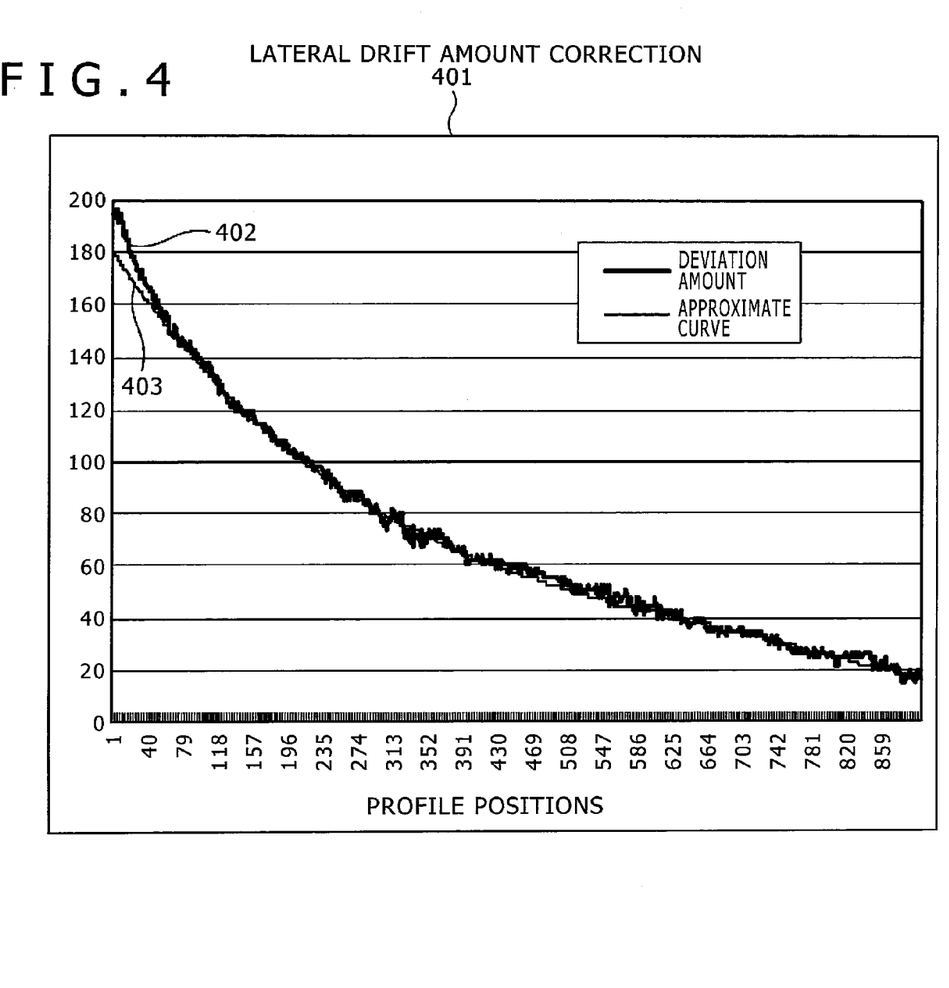
FIG. 4 is a graph showing lateral drift amount correction.

FIG. 4 is a drawing showing the drift amount in the lateral direction along the entire image. The actual measured drift amount 402 contains an error due to effects of noise and fluctuations in the shape during measurement, etc. However, the drift amount continuously fluctuates when the cause of the drift is established as the drift from the time after the stop of sampling stage stop operation until, the sampling stage stops. Variations due to the effects of noise and so on can be alleviated by calculating the approximate curve from the measured drift amount. The method for calculating the approximate curve is the least squares approximation.

Figure 5:
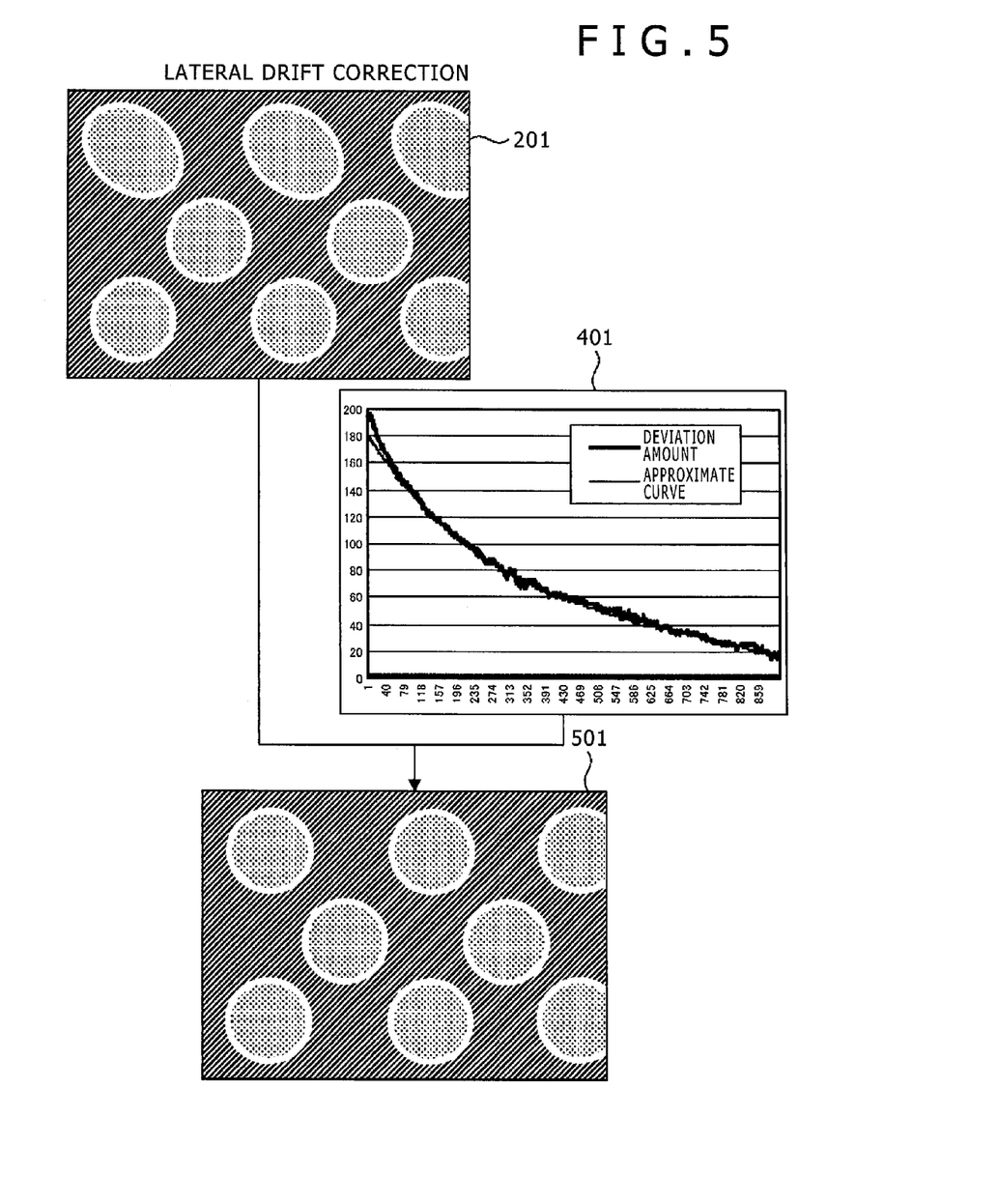
FIG. 5 is illustrations showing lateral drift correction.

FIG. 5 is illustrations showing the method for correcting the drift in the lateral direction. In the observation image 201, a lateral drift-corrected image 501 can be obtained by shifting laterally one line at a time in the lateral direction according to the approximation curve of the drift amount found from FIG. 4.

Figure 6:
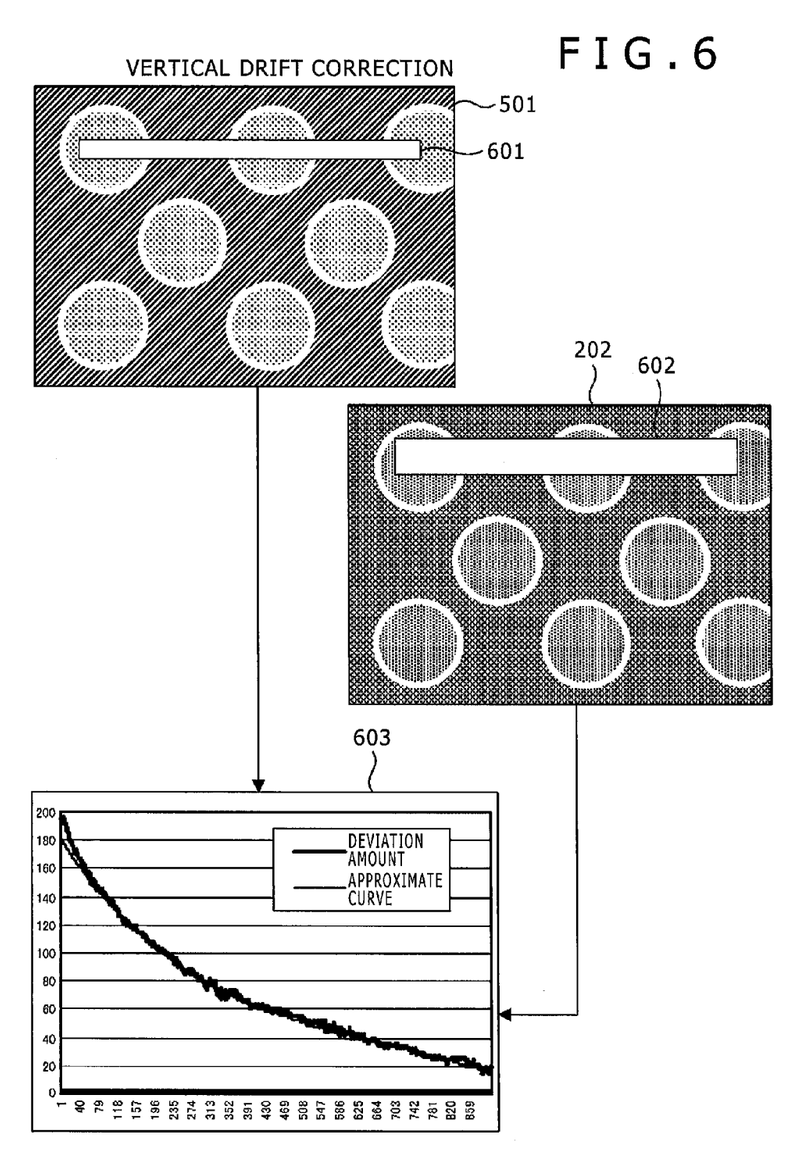
FIG. 6 is illustrations showing vertical drift correction.

FIG. 6 is a drawing for describing the method for correcting the drift amount in the vertical direction. The lateral drift amount is featured in being measured as the image displacement however vertical drift appears as extensions and contractions in the image. Methods that simply compare profiles on a line therefore cannot detect the vertical drift amount. The vertical drift amount is therefore calculated by measuring what section in the correction reference image 202 matches a sectional area within the observation image. In this method, a reference region 601 is first of all set at an optional position in the lateral drift-corrected image 501. A correction position search region 602 is next set at a position identical to the reference region 601 that was set in the lateral drift-corrected image 501 on the correction reference image 202. The vertical drift amount can next be calculated by detecting a position having the same shape as the reference region 601 from the correction position search region 602. The correction position search region 602 is however set to a region wider than the reference region 601 in order to detect a section having the same shape as the reference region 601 within the correction search region 602. A method to search for an identical shape is widely known as template matching using a normalized correlation. The drift amount for the entire image can be calculated by calculating the drift amount while shifting the reference region 601 and correction position search region 602 up and down. In the vertical drift amount, effects from noise and so on may sometimes cause variations in the drift amount the same as with the lateral drift amount so an approximate curve is also found for the vertical drift amount.

Figure 7:
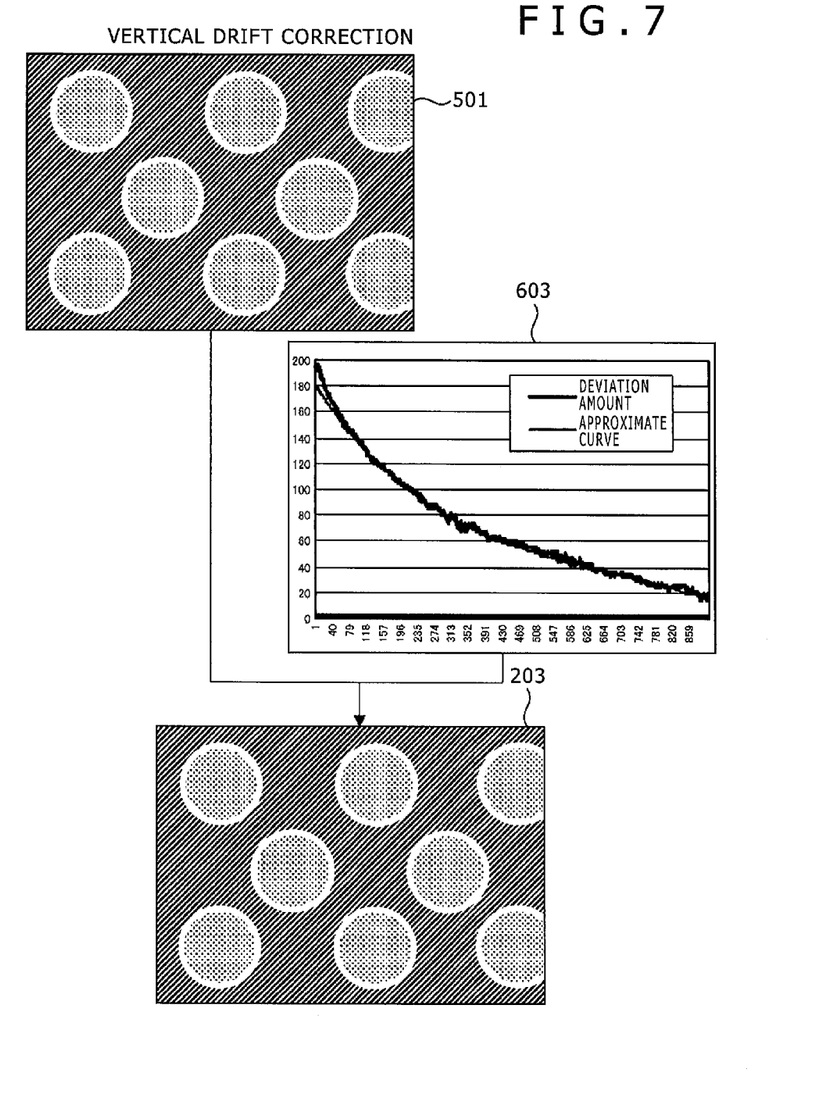
FIG. 7 is illustrations showing vertical drift correction.

FIG. 7 shows the method for correcting the vertical drift amount. In the lateral drift-corrected image 501, the vertical drift amount can be performed by shifting the image vertically according to the approximate curve for the drift amount found in FIG. 6. However, drift in the vertical direction cannot be corrected just by merely shifting and copying the vertical line. Such correction is not possible because the drift amount in the vertical direction appears on the image as extensions and contractions in the shape. A corrected observation image 203 can be obtained by calculating which position in the lateral drift-corrected image 501 matches which of the respective pixels in the corrected observation image 203 according to the approximate curve for the drift amount found in FIG. 6; and calculating the value of each pixel in the corrected observation image 203 from performing interpolation calculation on the lateral drift-corrected image 501.

The areas (profile position 301, 302, reference region 601, correction position search region 602) for detecting the drift amount and method for finding the correction curve from the drift amount must be set in order to calculate the lateral and vertical drift amounts. One way to set these areas and method is to establish fixed areas and a method beforehand. Moreover, a method to find the area for detecting the drift amount and find the correction curve from the detected drift amount can be input by the correction condition input device 103.

Figure 8:
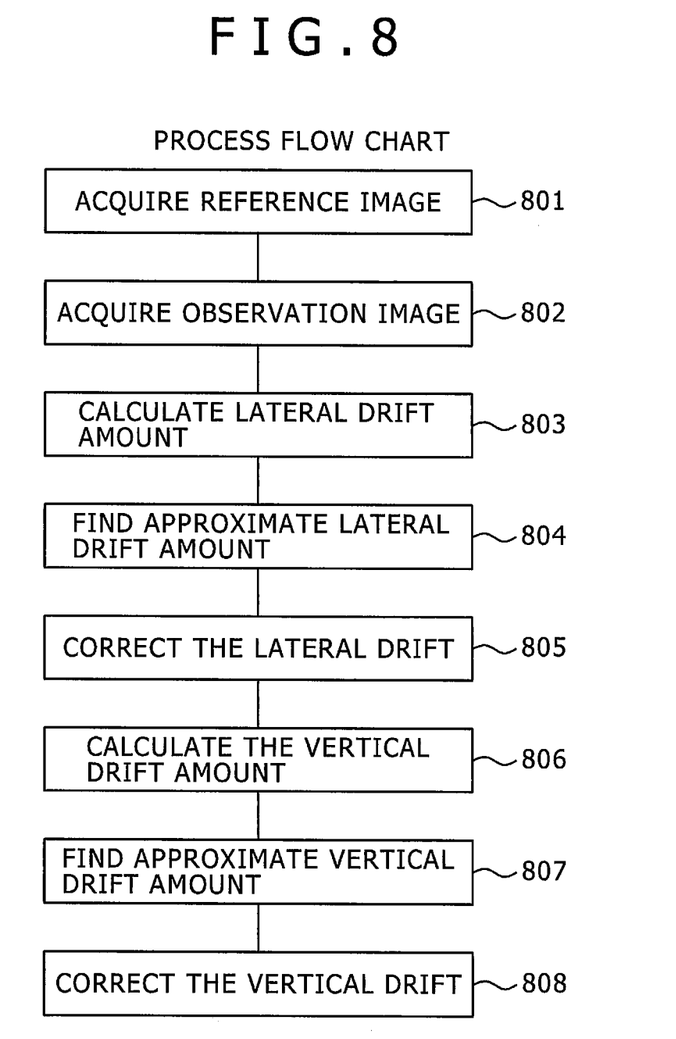
FIG. 8 is a chart showing the processing flow.

FIG. 8 shows the processing flow of the present invention. An acquire reference image 801 obtains the correction reference image 202. An acquire observation image 802 obtains the observation image 201. The lateral drift amount is then calculated by the calculate lateral drift amount 803 using the correction reference image 202 obtained by the acquire reference image 801 and the observation image 201 obtained by the acquire observation image 802. A find approximate lateral drift amount 804 sets an approximate lateral drift amount calculated by calculate lateral drift amount 803 and calculates an approximate curve for the lateral drift amount. In the correct the lateral drift correction 805, the lateral drift amount is corrected by using the approximate curve for the lateral drift amount and the observation image 201, and acquires the lateral drift-corrected image 501.

A calculate the vertical drift amount 806 calculates the vertical drift amount by using the lateral drift-corrected image 501 corrected in the lateral drift correction 805 and the correction reference image 202 obtained in acquire reference image 801. The find approximate vertical drift amount 807 approximates the vertical drift amount calculated by vertical drift amount 806, and calculates the approximate curve of the vertical drift amount. The correct the vertical drift 808 corrects the vertical drift amount by utilizing the lateral drift-corrected image 501 and the approximate curve for the vertical drift amount, and obtains the corrected observation image 203.

Second Embodiment

Figure 9:
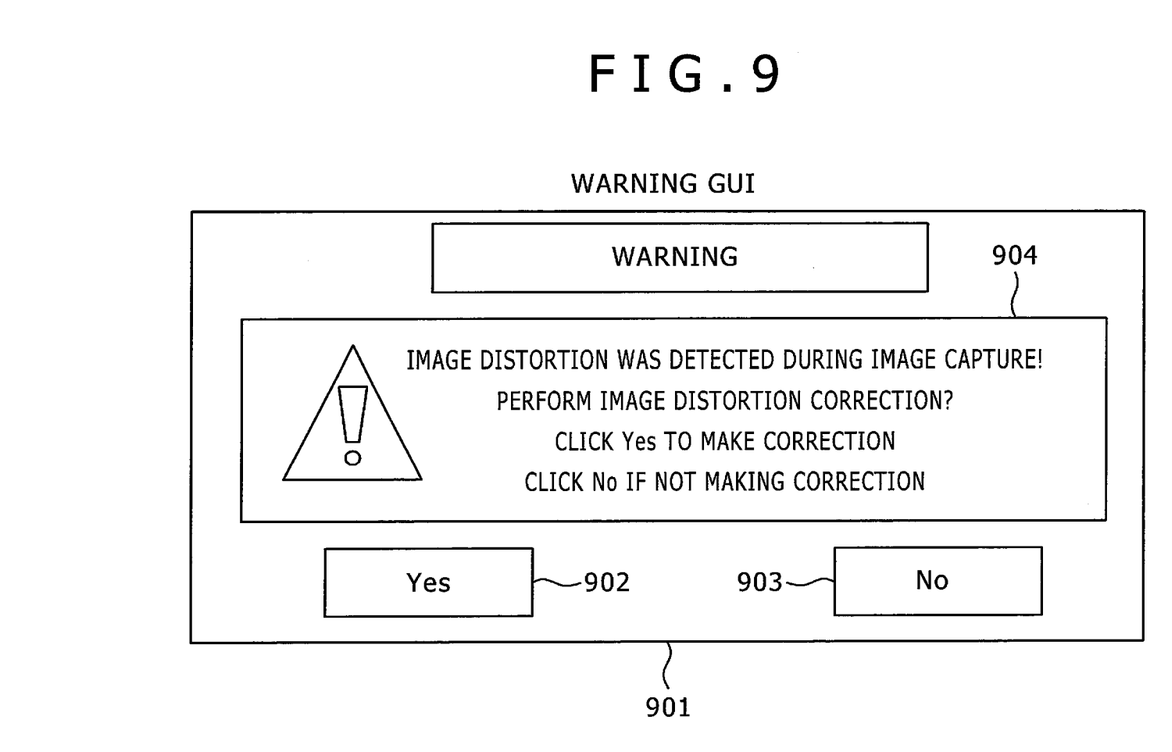
FIG. 9 is a drawing of the warning GUI.

The second embodiment of the present invention is described next using FIG. 9. In addition to the methods described so far, user support is further provided by way of the operating screen. A warning screen 901 contains a warning character string 904, a first button 902, and a second button 903. If drift was detected in the image then the warning screen 901 is displayed to the user to show that the captured image contains drift. The user at this same time selects on the warning screen 901 whether or not to execute drift correction of the captured image. To make the selection, the user clicks a first button 902 or a second button 903 to permit or abort drift correction.

LIST OF REFERENCE SIGNS

101 Charged particle microscope
102 Image input device
103 Correction condition input device
104 Arithmetic logic unit (ALU)
105 Storage device
106 Image output device
201 Observation image
202 Correction reference image
203 Corrected observation image
301 Observation image profile position
302 Correction reference image profile position
303 Observation image profile
304 Correction reference image profile
401 Lateral drift amount graph
402 Lateral drift measurement amount
403 Lateral drift amount approximate curve
501 Lateral drift-corrected image
601 Reference region
602 Correction position search region
603 Vertical drift amount graph
801 Acquire reference image
802 Acquire observation image
803 Calculate lateral drift amount
804 Find approximate lateral drift amount
805 Correct the lateral drift
806 Calculate the vertical drift amount
807 Find approximate vertical drift amount
808 Correct the vertical drift
901 Warning screen
902 First button
903 Second button
904 Character string

The invention claimed is:

1. A scanning electron microscope system comprising:
a scanning electron microscope including a sampling stage capable of mounting the specimen for observation and moving to change the observation position of the specimen;
an image input device to obtain the signals measured by the scanning electron microscope as images;
a storage device to store the images that were input;
an arithmetic logic unit (ALU) to process the image and make various types of corrections;
an input device to enter the conditions for making corrections; and
an output device to output the corrected image,
wherein the scanning electron microscope system measures a correction reference image in a shorter time than the observation image: and
detects distortion in the observation image caused by drift of the sampling stage that occurred during specimen observation in line units on the applicable observation image by comparing the observation image with the correction reference image, and corrects the detected distortion in line units, and outputs an image with lower distortion.

2. The scanning electron microscope system according to claim 1,
wherein one correction reference image is acquired in order to correct distortion in one observation image.

3. The scanning electron microscope system according to claim 1,
wherein distortion in the observation image is corrected by detecting the distortion in the lateral direction in the observation image as the drift amount on the line in the lateral direction the observation image by comparing the observation image with the correction reference image.

4. The scanning electron microscope system according to claim 1,
wherein distortion in the observation image is corrected by detecting the distortion in the vertical direction in the observation image as the drift amount on the line in the vertical direction in the observation image by comparing the observation image with the correction reference image.

5. The scanning microscope system according to claim 1,
wherein in the lateral and vertical drift amount in the observation image, an approximate curve is found from the applicable drift amount, and the distortion in the observation image is corrected by utilizing the drift amount found from the applicable approximate curve as the correction amount.

6. The scanning electron microscope system according to claim 1,
wherein the presence or absence of drift in the observation image is displayed on the operating screen.

* * * * *